United States Patent
Bonaria

(10) Patent No.: US 11,105,841 B2
(45) Date of Patent: Aug. 31, 2021

(54) FLYING PROBE ELECTRONIC BOARD TESTER, AND TEST METHOD THEREOF

(71) Applicant: SPEA S.P.A., Volpiano (IT)

(72) Inventor: Luciano Bonaria, Volpiano (IT)

(73) Assignee: SPEA S.P.A., Volpiano (IT)

( * ) Notice: Subject to any disclaimer, the term of this patent is extended or adjusted under 35 U.S.C. 154(b) by 121 days.

(21) Appl. No.: 16/477,763

(22) PCT Filed: Jan. 17, 2018

(86) PCT No.: PCT/IB2018/050288
§ 371 (c)(1),
(2) Date: Jul. 12, 2019

(87) PCT Pub. No.: WO2018/134746
PCT Pub. Date: Jul. 26, 2018

(65) Prior Publication Data
US 2019/0339323 A1    Nov. 7, 2019

(30) Foreign Application Priority Data

Jan. 17, 2017   (IT) .......................... 102017000004579

(51) Int. Cl.
*G01R 31/20* (2006.01)
*G01R 31/28* (2006.01)
*G01R 1/067* (2006.01)

(52) U.S. Cl.
CPC ..... *G01R 31/2808* (2013.01); *G01R 1/06716* (2013.01)

(58) Field of Classification Search
CPC ............ G01R 31/2803; G01R 31/2806; G01R 31/2808; G01R 31/2831; G01R 31/2887; G01R 31/2891; G01R 1/06716; G01R 1/06794; G01R 1/0491
See application file for complete search history.

(56) References Cited

U.S. PATENT DOCUMENTS

| 4,471,298 A * | 9/1984 | Frohlich ............ G01R 31/2805 324/72.5 |
| 5,412,314 A * | 5/1995 | Fukunaga .......... G01R 31/2893 324/756.02 |

(Continued)

FOREIGN PATENT DOCUMENTS

WO    2006133808 A1    12/2006

OTHER PUBLICATIONS

No Author. "Hohe Flexibilitat bei niedrigen Testkosten." Polyscope 14/12. Aug. 12, 2012. pp. 28-29. XP055412275. http://www.polyscope.ch/site/assets/files/21332/ps1412 28 29.pdf. Retrieved Oct. 4, 2017. 2 pages.

(Continued)

*Primary Examiner* — Thang X Le
(74) *Attorney, Agent, or Firm* — Leason Ellis LLP

(57) ABSTRACT

Machine with flying probes for testing electronic boards comprising a conveyor for loading/unloading the boards into/from the testing station, a plurality of flying probes suitable to interact with predetermined points of each board and a plurality of contacting devices arranged at the sides of the working volume of the flying probes and suitable to cooperate with contact areas arranged on one edge of the board.

7 Claims, 5 Drawing Sheets

(56) References Cited

U.S. PATENT DOCUMENTS

| | | | | | |
|---|---|---|---|---|---|
| 5,469,064 | A | * | 11/1995 | Kerschner | G01R 1/07 |
| | | | | | 324/537 |
| 6,137,303 | A | * | 10/2000 | Deckert | G01R 31/2831 |
| | | | | | 324/757.03 |
| 9,618,568 | B2 | * | 4/2017 | Lee | G01R 31/2893 |

OTHER PUBLICATIONS

No Author. "SPEA—Flying Probe Tester 4060—Y2010." Equipment, SPEA Automatic Test. YouTube, Dec. 3, 2010. www.youtube.com/watch?v=EW7AhHe4Q8I. Retrieved Oct. 4, 2017. 1 page.

No Author. "Flying Probe S2." SPEA. May 13, 2015. www.stollelectronic.de/ data/media/pdf /media 260.pdf. Retrieved Oct. 4, 2017. 4 pages.

Wong et al. "Phase Change Memory and paradigm shift to in-system programming." 2nd Asia Symposium on Quality Electronic Design (ASQED). IEEE, 2010. pp. 371-374.

International Search Report and Written Opinion in corresponding International Patent Application No. PCT/IB2018/050288 dated May 15, 2018. 16 pages.

\* cited by examiner

FLYING PROBE ELECTRONIC BOARD TESTER, AND TEST METHOD THEREOF

CROSS-REFERENCE TO RELATED PATENT APPLICATIONS

This application is a U.S. National Stage Application under 35 U.S.C. § 371 of International Patent Application No. PCT/IB2018/050288, filed Jan. 17, 2018, which claims priority from Italian Patent Application No. 102017000004579 filed on Jan. 17, 2017, both of which are incorporated by reference in their entireties.

TECHNICAL FIELD

The present invention relates to a flying probe electronic board tester, and test method thereof.

BACKGROUND ART

As is known, for testing electronic boards on line so-called testing machines known as "flying probes" are frequently used.

In these machines, the boards are loaded/unloaded into and from the testing station of the machine by means of a conveying device, usually consisting of motorized belts that cooperate with opposite side edges of the boards.

In the testing station, the board is blocked and contacted by a plurality of flying probes, each able to contact the board in a succession of pre-established contact points, thus allowing the machine control unit to exchange with the board the necessary signals for testing the same in as short a time as possible.

Since a full functional test of the board is normally possible only if the board is powered, in addition to the flying probes the testing machines normally also envisage the use of a fixed connector, i.e. configured to contact the board in a fixed position during the test cycle.

In addition to the power supply current, the fixed connector is normally configured to cooperate with a plurality of fixed contacts of the board, arranged in a known manner, with a diagnostic function.

The fixed connector typically comprises a plurality of contact needles, spring loaded, each of which exerts on the board a non-negligible load (typically to the order of 100 g). As a result, the number of contacts is necessarily limited, to avoid unacceptable deformations of the board.

According to another known technique, the power supply and the diagnostic contacts can be managed by means of a needle bed solution, typically arranged under the board; this solution, however, prevents the use of flying probes on both sides of the board, and has high fitting costs.

Another possibility is to use a manually connected fixed connector. However, this solution cannot be used in fast, on-line applications.

DISCLOSURE OF INVENTION

The object of the present invention is to provide a machine with flying probes for testing electronic boards, which is free of the drawbacks associated with the known testing machines.

The present invention also relates to a testing method using the above testing machine.

BRIEF DESCRIPTION OF THE DRAWINGS

For a better understanding of the present invention, a preferred embodiment is described below, purely by way of a non-limiting example and with reference to the attached drawings, in which.

BEST MODE FOR CARRYING OUT THE INVENTION

Figure 1:
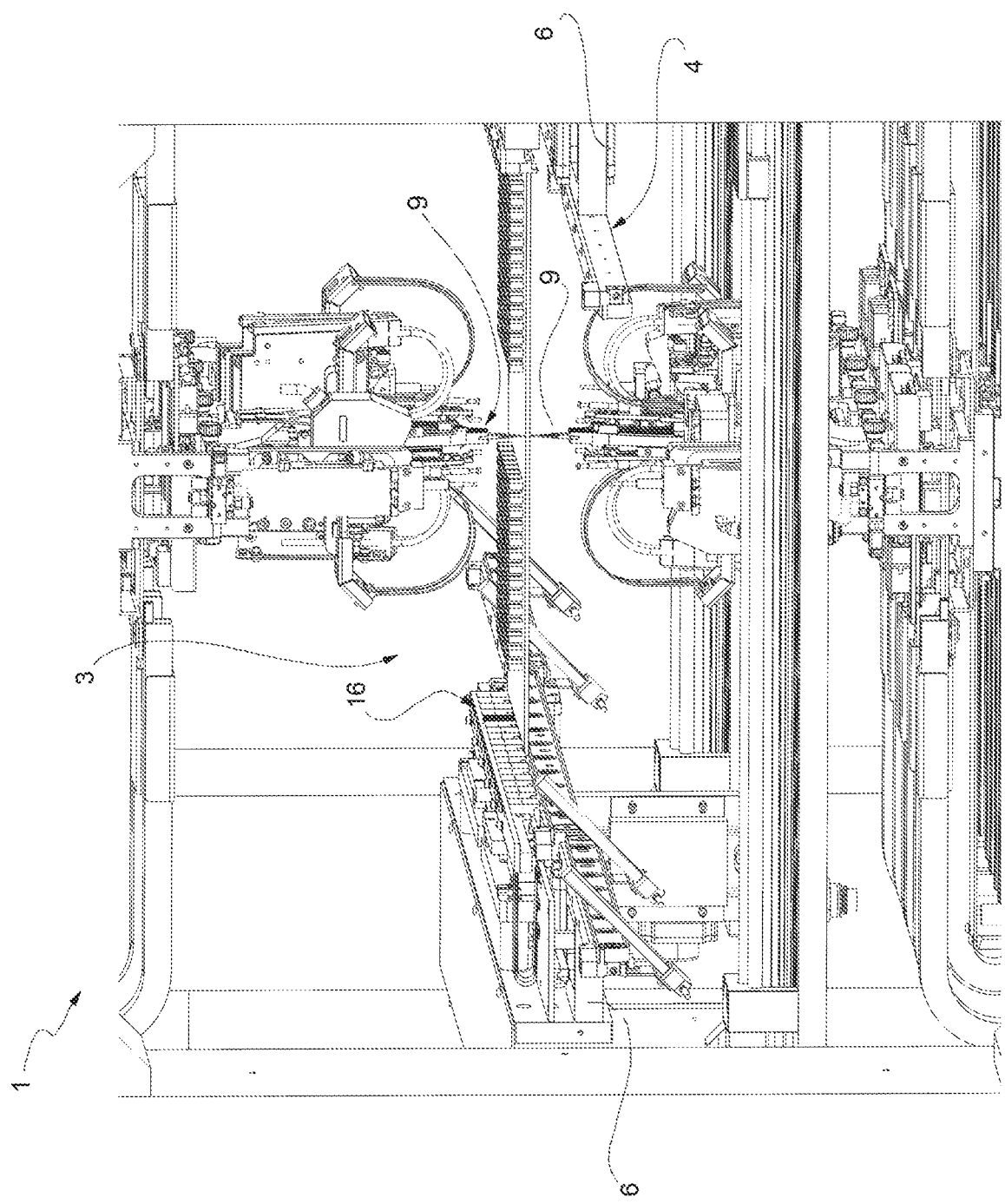
FIG. 1 is a partial perspective view of a machine for testing electronic boards made according to the invention.
Figure 3:
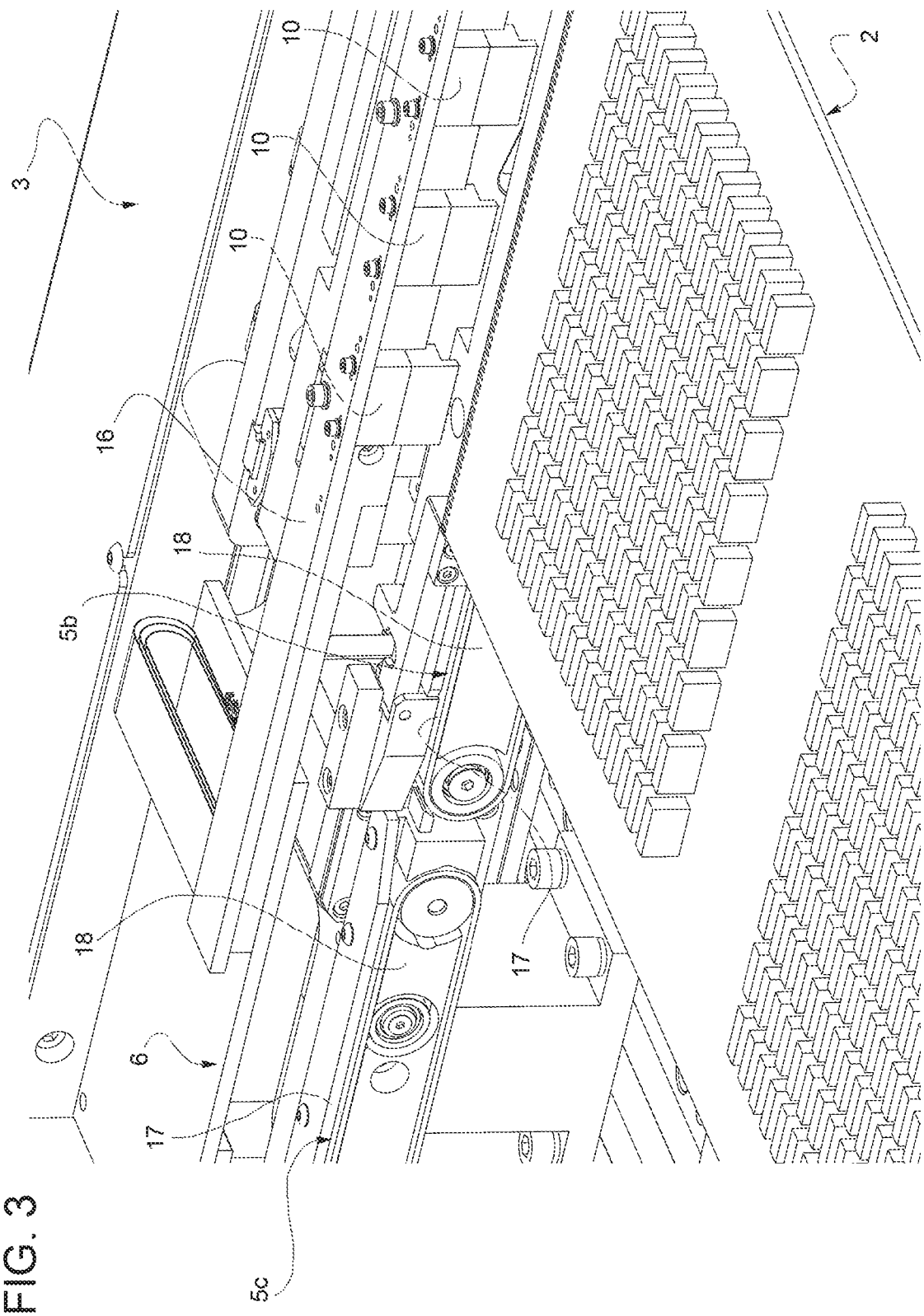
FIG. 3 is a partial perspective view of a testing station of the machine in FIG. 1, in a first operating position.
Figure 4:
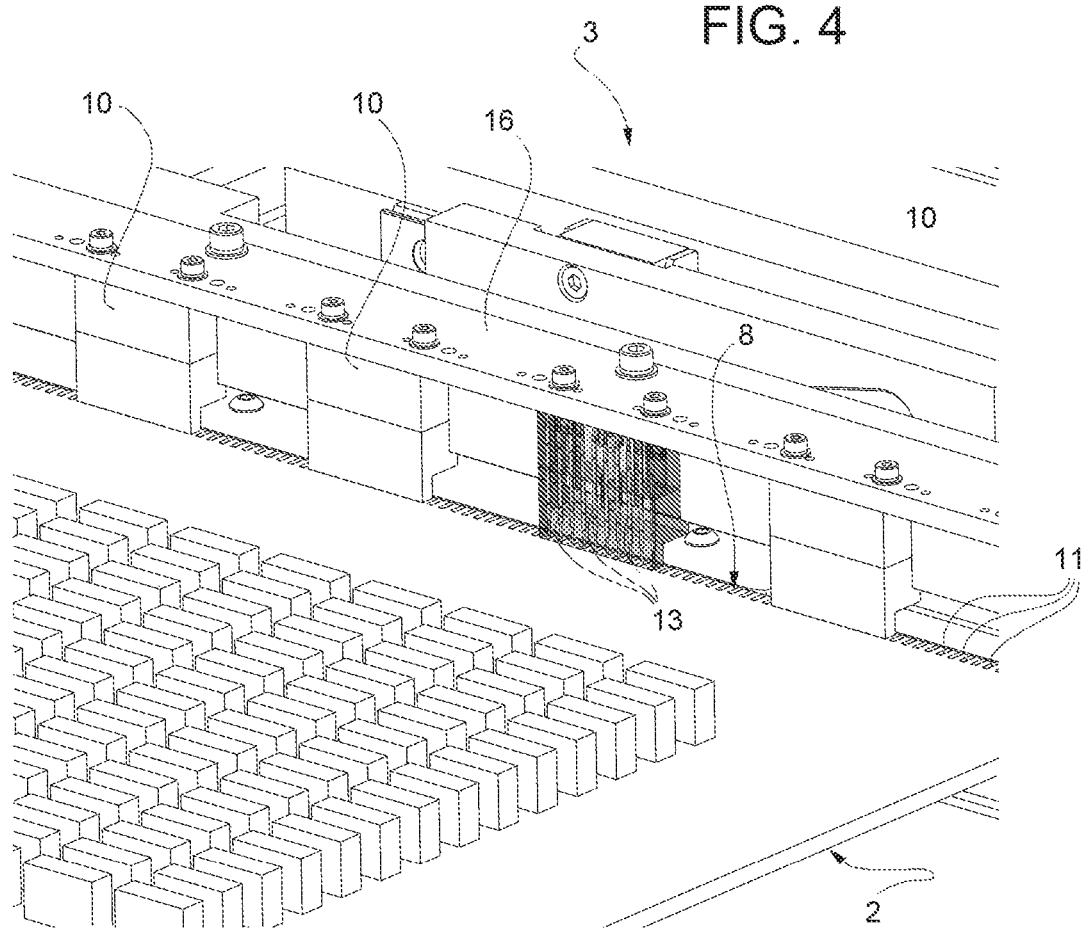
FIG. 4 shows a detail of FIG. 3 on an enlarged scale and in a second operating position.
Figure 5:
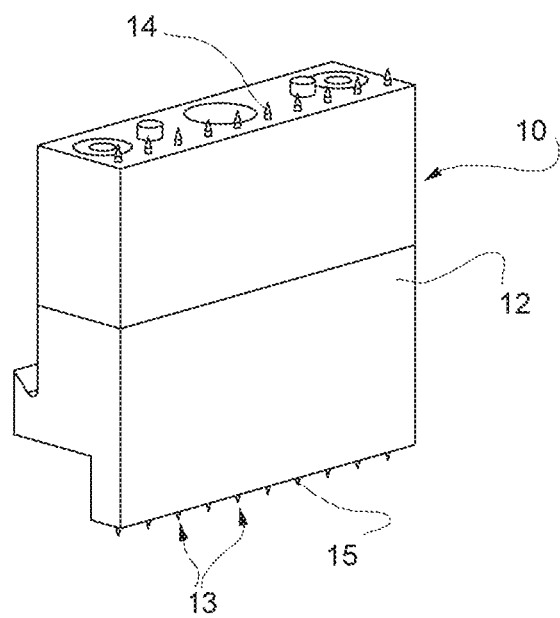
FIG. 5 is a perspective view of a contacting device of the testing station of FIGS. 3 and 4.
Figure 6:
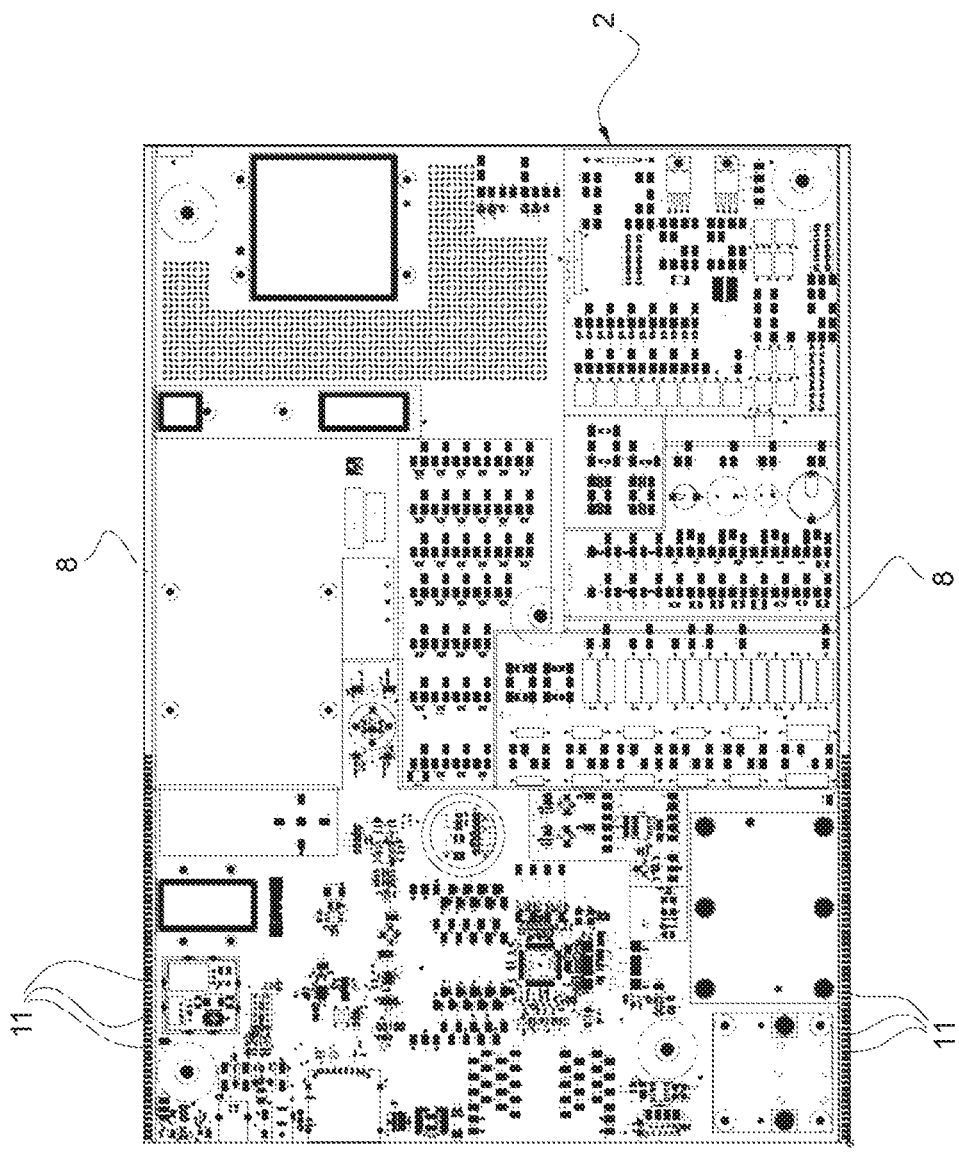
FIG. 6 shows an example of an electronic board suitable to be tested in a machine according to the present invention.

With reference to FIG. 1, reference numeral 1 globally denotes a flying probe testing machine for testing electronic boards 2, shown schematically in FIGS. 3 and 4 and in an exemplary embodiment in FIG. 5. It should be noted hereto that the term "electronic board" is broadly understood here, in particular also including so-called "board panels", i.e. sets of identical boards joined together by frangible portions so as to allow their separation after testing.

The machine 1 comprises a testing station 3 (FIGS. 3, 4) and a belt conveyor 4 suitable to load/unload the boards 2, in succession, into/from the testing station 3.

Figure 2:
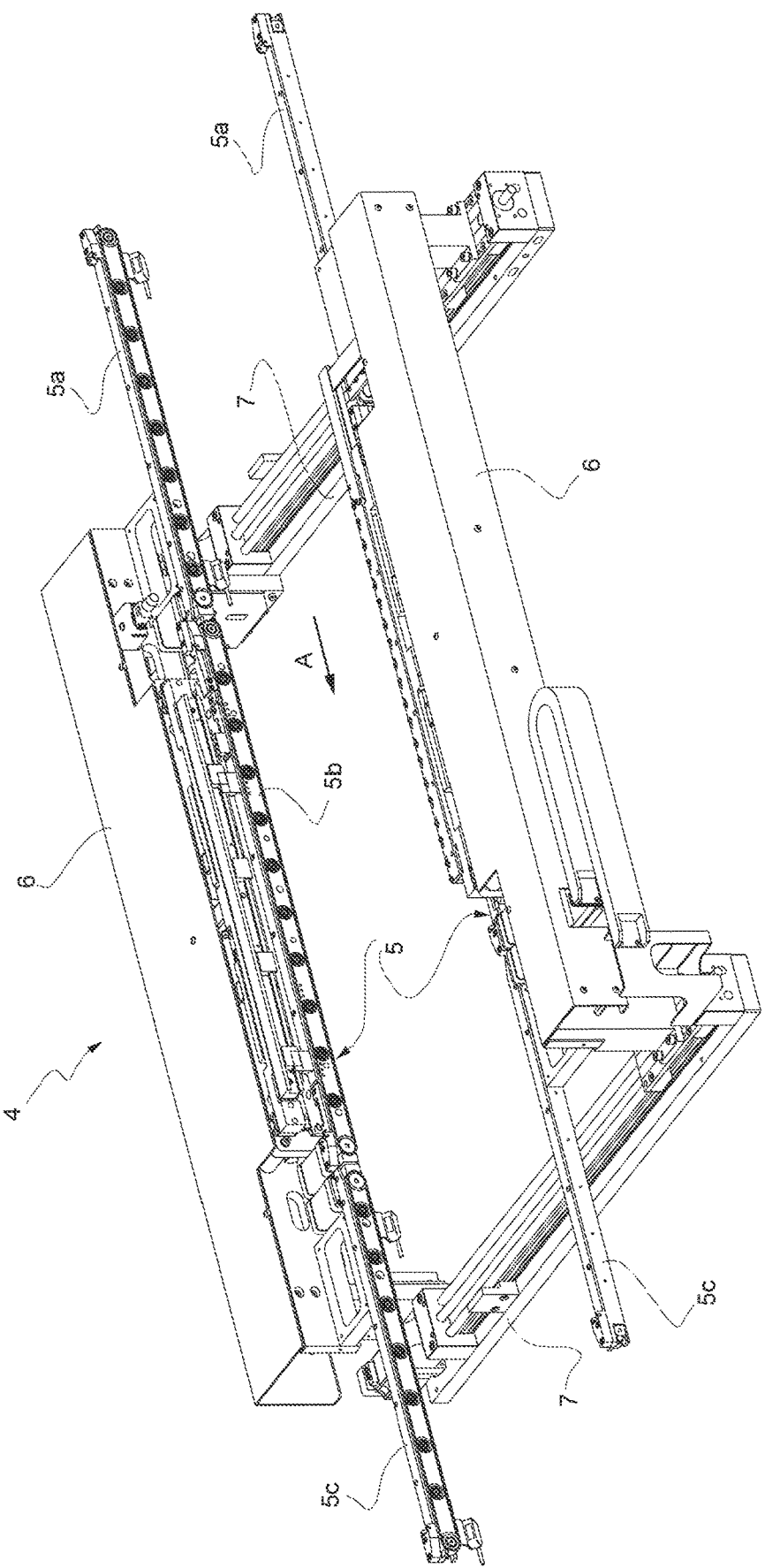
FIG. 2 is a perspective view of a board conveyor in the machine in FIG. 1.

The conveyor 4 comprises (FIG. 2) three pairs of belts, globally denoted by reference numeral 5, arranged longitudinally at opposite sides of the station 3. More precisely, the conveyor 4 comprises a pair of feed belts 5a, a pair of intermediate belts 5b and a pair of unloading belts 5c, which are selectively operated, as will be better described below, to load or unload the boards 2 into/from the testing station 3. Conveniently, the belts 5 are borne by respective longitudinal supports 6 mounted on transversal guides 7 to allow the transverse distance between the belts 5a, 5b, 5c to be adapted and thus adapt the conveyor 4 to different sizes of the boards 2 to be tested.

The boards 2 rest on the belts 5 with their side edges 8; in particular, the contact between the belts 5 and the boards 2 takes place on a bottom side of the side edges 8. Conveniently, the upper branches 17 of the belts 5 slide on fixed support inserts 18 (FIG. 3), having the purpose of absorbing the vertical loads and preventing the downward bending of said branches.

The testing machine 1 comprises, in a known manner, a plurality of flying probes 9 able to interact with the boards 2, from above and below, in a conventional manner (FIG. 1).

According to the present invention, in addition to the flying probes 9, the machine 1 comprises at least one contact device 10 suitable to interact with at least one side edge 8 of the board 2, where contact areas 11 are provided on a side of the board opposite the one cooperating with the belts 5. In the example illustrated, the machine 1 comprises a plurality of contacting devices on each side of the machine 1, suitable to cooperate with respective side edges 8 opposite the boards 2, provided for the purpose with contact areas 11 aligned along said edges.

These contact areas 11, conveniently made in the form of longitudinally spaced rectangular pads, can be used to supply power to the board 2 and to exchange diagnostic signals with the machine 1.

Each contact device 10 (FIG. 5) essentially comprises a casing 12 in which electric needle contacts 13 are vertically housed, for example of the type known as Pogo® Pin. The needle contacts 13 have an upper end 14 connected to a board (not shown) forming part of the machine, and a lower end 15 suitable to come into contact with the boards 2. The ends 14, 15 are spring loaded, in a known manner, in opposite directions towards the outside of the casing 12.

The contacting devices 10 are conveniently fixed on supports 16, arranged one on each side of the testing station, which are movable vertically with respect to the supports 6 of the belts 5. In particular, the supports 16 are movable between a raised position (FIG. 3) which allows insertion of the board 2 conveyed by the belts 5, and a lowered position in which the contacting mechanisms cooperate with the side edge 8 of the board 2 and lock it to the relative belt 5b.

The operation of the testing machine 1, already partly evident from the above, is as follows.

When a board 2 is loaded into the testing station 3 by the conveyor 4, by operating the belts 5a, 5b, the contacting devices 10 are raised. As soon as the board 2 reaches the testing position, the belts 5a, 5b are stopped, the supports 16 are lowered and the contacting mechanisms 10 block the side edges 8 of the board 2 onto the relative belts 5b. At the same time, the needle contacts 13 cooperate elastically with the respective contact areas 11, enabling the power supply to the board 2 and the performance of diagnostic procedures.

In parallel to the above procedure, the flying probes 9 of the machine 1 can interact in a conventional manner with prefixed points of the board 2, according to a predetermined test cycle, since the contact areas 11 are formed on the side edges 8 of the boards 2 and the contacting mechanisms 10 are arranged externally to the working volume of the flying probes 9.

At the end of the test, the contacting devices 10 are raised, leaving the boards 2 free, and are discharged from the testing station 3 by operating the intermediate belts 5b and the unloading belts 5c.

From an examination of the characteristics of the machine 1 and of the relative operating method, the advantages that it achieves are evident.

The machine 1 allows the board 2 to be contacted on specific contact areas 11 located on one or both the side edges 8 of the said board, by means of one or more contacting mechanisms 10 provided with needle contacts 13. Since the board 2 rests on the side edges 8, the mechanical load exerted by the needle contacts 13 is absorbed by the conveyor 4, and in particular by the support inserts 18, and does not produce deformations on the board itself.

The problems associated with fixed connectors of the conventional type are thus eliminated.

The invention claimed is:

1. A tester (1) for testing electronic boards (2) including:
    a test station (3),
    a conveyor (4) for loading/unloading the boards (2) into/from the test station (3);
    a plurality of flying probes (9) configured to interact with pre-set points of each board (2), when disposed in the test station (3), according to a pre-set test cycle;
    the conveyor (4) including at least a pair of conveyor elements (5) configured to cooperate with opposite lateral edges (8) of the boards (2) and located at opposite sides of a working volume of the flying probes (9);
    at least one contacting device (10) disposed in the test station (3) over at least one of the conveyor elements (5),
    the contacting device (10) including a plurality of contacts (13) aligned with one another in a conveying direction and configured to cooperate with respective contact areas (11) aligned with one another along at least one of the lateral edges (8) of said boards (2),
    the contacting device (10) being movable between a first position allowing loading/unloading the board (2) into/from the test station (3) and a second position in which it blocks the board (2) on the conveying element (5) and establishes an electric connection between said contacts (13) of the contacting device (10) and said contact areas (11) of the board (2).

2. A tester as claimed in claim 1, wherein a plurality of contacting devices (10) are aligned with one another in the conveying direction and carried by a common supporting element (6).

3. A tester as claimed in claim 2, wherein a first plurality of contacting devices (10) and a second plurality of contacting devices (10) are disposed at opposite sides of the working volume of the flying probes (9).

4. A tester as claimed in claim 1, wherein the conveying elements are belts (5).

5. A tester as claimed in claim 1, wherein said at least one contacting device (10) includes a plurality of needle contacts (13) configured to cooperate elastically with respective contact areas (11) of the board (2).

6. A tester as claimed in claim 4, further including bearing inserts (18) on which upper strands (17) of the belts (5) slide, said bearing inserts (18) being configured to adsorb vertical loads on said strands.

7. A method of testing an electronic board (2) in a flying probe tester (1) comprising steps of:
    loading the electronic board (2) into a test station (3) of a machine (1) by means of a conveyor (4) including at least a pair of conveying elements (5) configured to cooperate with opposite lateral edges (8) of the board (2) and located at opposite sides of a working volume of flying probes (9);
    contacting at least one of the lateral edges (8) of the board (2), provided with a plurality of contact areas (11) aligned along said edge, by means of a contacting device (10) provided with a plurality of contacts (13) configured to cooperate with the contact areas (11) on the edges of the board (2);
    executing a test cycle by means of the flying probes (9) while the board (2) is blocked by the contacting device (10);
    raising the contacting device (10); and
    unloading the board (2) from the test station (3).

* * * * *